United States Patent [19]
Sung

[11] Patent Number: 6,033,968
[45] Date of Patent: Mar. 7, 2000

[54] METHOD FOR FORMING A SHALLOW TRENCH ISOLATION STRUCTURE

[75] Inventor: Kuo-Tung Sung, Hsinchu, Taiwan

[73] Assignee: United Integrated Circuits Corp., Hsinchu, Taiwan

[21] Appl. No.: 09/280,627

[22] Filed: Mar. 29, 1999

[51] Int. Cl.⁷ .................................................. H01L 21/76
[52] U.S. Cl. ...................... 438/424; 438/437; 438/978; 148/DIG. 50
[58] Field of Search ..................... 438/424, 427, 438/435, 437, 296, 978; 148/DIG. 50

[56] References Cited

U.S. PATENT DOCUMENTS

| | | | |
|---|---|---|---|
| 5,696,019 | 12/1997 | Chang | 148/DIG. 50 |
| 5,920,786 | 7/1999 | Pham et al. | 438/424 |
| 5,933,749 | 8/1999 | Lee | 438/435 |
| 5,945,352 | 8/1999 | Chen et al. | 438/424 |
| 5,953,621 | 9/1999 | Gonzalez et al. | 438/296 |

Primary Examiner—Trung Dang
Attorney, Agent, or Firm—J.C. Patents Jiawei Huang

[57] ABSTRACT

A method for forming a shallow trench isolation structure. A mask layer having an opening is formed over a substrate to pattern a shallow trench. A sloped spacer is formed on the sidewalls of the opening. The mask layer and the spacer are used as a hard mask, and a portion of the substrate is removed by anisotropic etching to form a shallow trench isolation structure. The sloped sidewalls of the shallow trench isolation structure and the substrate surface intersect at an obtuse angle. Therefore, the structure prevents stress and avoids leakage current.

17 Claims, 2 Drawing Sheets

METHOD FOR FORMING A SHALLOW TRENCH ISOLATION STRUCTURE

CROSS-REFERENCE TO RELATED APPLICATION

This application claims the priority benefit of Taiwan application serial no. 88101195, filed Jan. 27, 1999, the full disclosure of which is incorporated herein by reference.

BACKGROUND OF THE INVENTION

1. Field of the Invention

The present invention relates to a method for forming a semiconductor device. More particularly. the present invention relates to a method for forming a shallow trench isolation structure.

2. Description of the Related Art

An isolation region is formed in an integrated circuit for preventing a short circuit from occurring between adjacent device regions on a substrate. Conventionally, a local oxidation of silicon (LOCOS) technique is widely utilized in the semiconductor industry to provide isolation regions on semiconductor device. However, since internal stress is generated and bird's beak encroachment occurs in the isolation structures. LOCOS cannot effectively isolate devices.

The shallow trench isolation (STI) technique has been developed to improve the bird's beak encroachment of the LOCOS so as to achieve an effective isolation structure. Typically, the STI process comprises the steps of using a mask to define and pattern a shallow trench on a substrate by anisotropic etching process, and then filling the shallow trench with oxide for use as a device isolation structure.

Conventionally, the sidewalls of the shallow trench isolation structure are usually perpendicular to the substrate surface; that is, the corner of the shallow trench isolation structure is a right angle. As a result, high stress occurs at the corner of the shallow trench isolation structure because the corner is a right angle. The stress leads to damage of the silicon lattices in the substrate surface. In a subsequent step, a gate oxide layer formed on the substrate is not able to form a predetermined thickness because the silicon lattices of the substrate surface are damaged. Therefore, a leakage current occurs at the corner of the shallow trench isolation structure. Many methods have been proposed to solve this problem; one method is that a patterned photoresist layer for defining the shallow trench be partially removed by a plasma ashing process, and then a portion of the substrate be removed by oxygen plasma etching to form the shallow trench. With sloped photoresist, the shallow trench will also has sloped profile due to pattern transfer effect during plasma etching. The polymer flow down the sidewalls of the shallow trench to protect the sidewalls of the shallow trench plasma etching. Therefore, the sloped shallow trench sidewall is formed by plasma ashing the photoresist layer after the photoresist layer has been exposed and developed. A width of the shallow trench is gradually decreased from top to bottom.

Since the sidewalls of the shallow trench and the substrate surface intersect at an obtuse angle; that is, the corner of the shallow trench formed by the method mentioned above is an obtuse angle. The stress is not easily generated and leakage current of the shallow trench isolation structure is avoided. However, the etching rate of the photoresist layer removed by oxygen plasma is hard to control, so that it is difficult to protect the sidewalls of the shallow trench by using the polymer formed from the photoresist layer. If the etching rate is too fast, the sidewalls of the shallow trench are easily etched by the oxygen plasma. Therefore, an angle between the substrate surface and the sidewalls of the shallow trench is decreased. If the etching rate is too slow, the shallow trench can not effectively isolate devices.

SUMMARY OF THE INVENTION

Accordingly, the purpose of the present invention is to provide a method for forming a shallow trench isolation structure.

To achieve these and other advantages and in accordance with the purpose of the invention, as embodied and broadly described herein, the invention provides a method for forming a shallow trench isolation structure. A substrate is provided, and a mask layer having an opening is formed over the substrate to define a shallow trench. The sidewalls of the opening are perpendicular to the substrate surface. A sloped spacer is formed on the opening sidewalls. The mask layer and the spacer are used as a hard mask, and a portion of the substrate is removed by anisotropic etching to form a trapezoidal opening. Then, the trapezoidal opening is filled with an insulation layer for use as a device isolation structure. The invention not only prevents stress generation and avoids leakage current, but also provides an easy control method for forming a shallow trench isolation structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
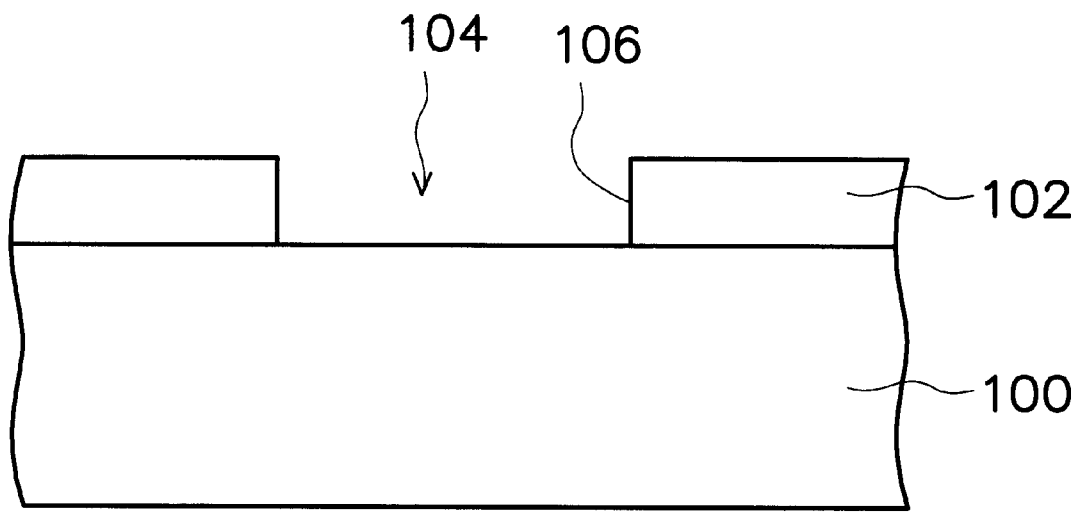
FIGS. 1A through 1D are schematic, cross-sectional views showing the processing steps for forming a shallow trench isolation structure according to the preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1D are schematic, cross-sectional views showing the processing steps for forming a shallow trench isolation structure according to the preferred embodiment of this invention.

Referring to FIG. 1A, a mask layer 102 having an opening 104 is formed over a substrate 100 to pattern a shallow trench. The mask layer 102 is made of a material such as silicon oxide or silicon nitride. Sidewalls 106 of the opening 104 are perpendicular to the substrate 100 surface.

Figure 1B:
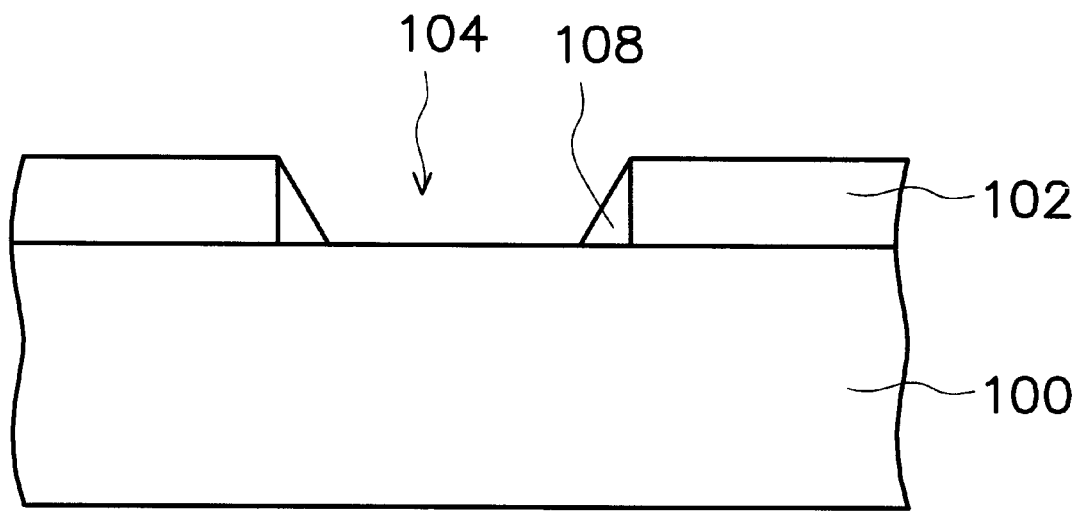

Referring to FIG. 1B, the mask layer 102 and the substrate 100 are covered by an insulator layer (not shown), and a portion of the insulator layer is removed, for example, by anisotropic etching to form a spacer 108 on the sidewalls 106 of the opening 104. The spacer 108 is made of a material such as silicon nitride. A surface of the spacer 108 is slanted, and a width of the spacer 108 gradually increases from top to bottom.

Figure 1C:
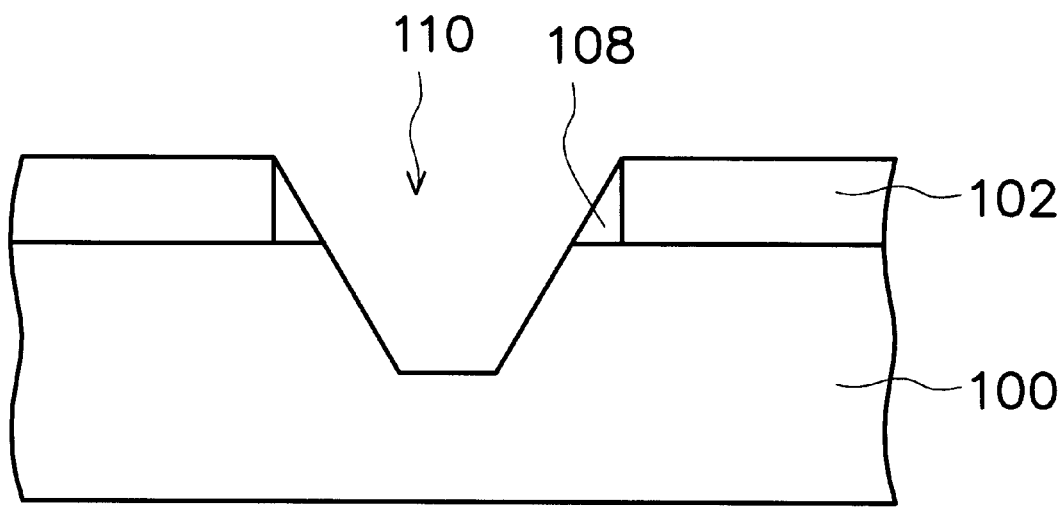

Referring to FIG. 1C, the mask layer 102 and the spacer 108 are used as a hard mask, and a portion of the substrate 100 is removed, for example, by anisotropic etching to form a trapezoidal opening 110. The anisotropic etching process is performed, for example, using plasma having carbon fluoride-containing compounds ($CF_x$) such as carbon tetrafluoride or trifluoro methane. An angle between sidewalls of the trapezoidal opening 110 and surface of the substrate 100 is an obtuse angle, and the sidewalls of the trapezoidal opening 110 have a slope similar to that of the spacer 108. A width of the trapezoidal opening 110 is gradually decreased from top to bottom.

During the anisotropic etching process, the plasma having carbon fluoride-contained compounds ($CF_x$) reacts with the substrate 100, so that a polymer is formed. The polymer flows down the sidewalls of an opening within the substrate 100 formed by the plasma. The polymer protects the sidewalls of the opening in the substrate 100 from plasma etching; thus it is difficult to etch the sidewalls of the opening in the substrate 100. When the opening is etched more deeply, the effect is obvious because the polymer is increasingly formed. Additionally, the width of the opening becomes narrower as the opening is etched more deeply. Therefore, a trapezoidal opening 10 whose bottom surface is narrower than its top opening is formed within substrate 100.

Figure 1D:
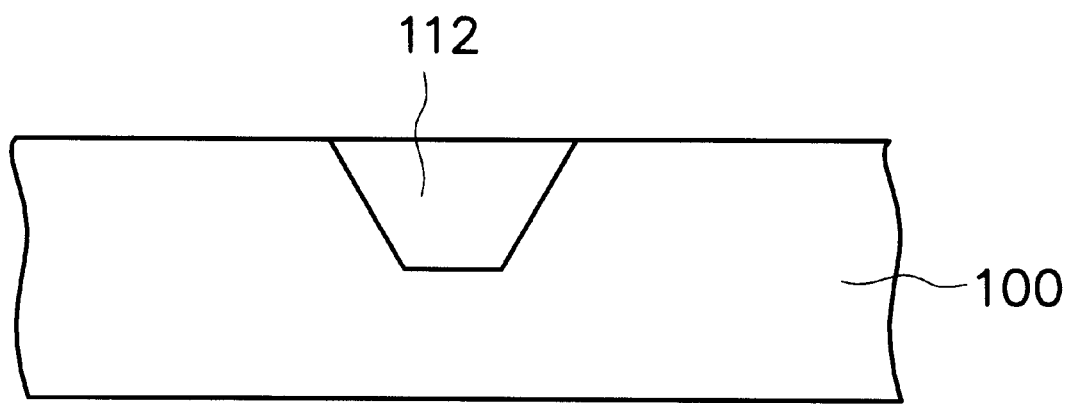

Referring to FIG. 1D, the trapezoidal opening 110 is filled with an insulation layer 112 made of a material such as silicon nitride or silicon oxide, and then an annealing process is preferably performed. The mask layer 102, the spacer 108 and a portion of the insulation layer 112 are removed to form a shallow trench isolation structure. The sloped sidewalls of the shallow trench isolation structure and the substrate surface intersect at an obtuse angle.

The invention provides a method for forming a shallow trench isolation structure. The sidewalls of the shallow trench and the substrate surface intersect at an obtuse angle, so that the angle between the sidewalls of the shallow trench and the substrate surface is larger than before. The sidewall of the shallow trench is slanted and the width of the shallow trench gradually decreases from top to bottom. The method avoids the stress and attains a predetermined thickness of the gate oxide layer, so that leakage current does not occur at the corner of the shallow trench isolation structure.

The invention provides a method for forming a shallow trench isolation structure. A mask layer 102 having an opening is provided, and a sloped spacer 108 is formed on the opening sidewalls. The mask layer 102 and the sloped spacer 108 are used as hard mask, and a portion of the substrate 100 is removed by anisotropic etching to form a trapezoidal opening 110 whose bottom surface is narrower than its top opening. The anisotropic etching is performed using plasma having carbon fluoride-contained compounds ($CF_x$). The method can avoid stress at the corner of the shallow trench isolation structure, and provide an easy control for forming a shallow trench isolation structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a shallow trench structure, comprising the steps of:

providing a substrate;

forming a mask layer having an opening exposing a portion of the substrate;

forming a sloped spacer on sidewalls of the opening to reduce the exposed portion of the substrate;

forming a trapezoidal opening in the substrate with the mask layer and the sloped spacer serving as a hard mask;

filling the trapezoidal opening with an insulation layer to form a shallow trench isolation structure having sloped sidewalls; and removing the mask layer and the sloped spacer.

2. The method of claim 1, wherein the mask layer includes a silicon oxide layer.

3. The method of claim 1, wherein the mask layer includes a silicon nitride layer.

4. The method of claim 1, wherein the sidewalls of the opening are perpendicular to the substrate surface.

5. The method of claim 1, wherein the sloped spacer includes silicon nitride.

6. The method of claim 1, wherein the step of forming the trapezoidal opening includes using anisotropic etching.

7. The method of claim 6, wherein the anisotropic etching includes using a plasma having carbon fluoride-contained compounds.

8. The method of claim 7, wherein the plasma includes carbon tetrafluoride.

9. The method of claim 7, wherein the plasma includes trifluoro methane.

10. The method of claim 1, wherein a top area of the trapezoidal opening is larger than a bottom area of the trapezoidal opening.

11. A method for forming a trapezoidal opening, comprising the steps of:

providing a substrate;

forming a mask layer having an opening exposing a portion of the substrate, wherein sidewalls of the opening are perpendicular to a surface of the substrate;

forming a sloped spacer on the sidewalls of the opening to reduce the exposed portion of the substrate; and forming a trapezoidal opening in the substrate with the mask layer and the sloped spacer serving as a hard mask, by anisotropic etching using a plasma having carbon fluoride-contained compounds.

12. The method of claim 11, wherein the mask layer includes a silicon oxide layer.

13. The method of claim 11, wherein the mask layer includes a silicon nitride layer.

14. The method of claim 11, wherein the sloped spacer includes silicon nitride.

15. The method of claim 11, wherein the plasma includes carbon tetrafluoride.

16. The method of claim 11, wherein the plasma includes trifluoro methane.

17. The method of claim 11, wherein a top area of the trapezoidal opening is larger than a bottom area of the trapezoidal opening.

* * * * *